(12) United States Patent
Neyer et al.

(10) Patent No.: US 7,191,085 B2
(45) Date of Patent: Mar. 13, 2007

(54) METHOD FOR TESTING AN ELECTRIC CIRCUIT

(75) Inventors: Thomas Neyer, Villach (AT); Erwin Thalmann, Villach (AT); Martin Versen, Feldkirchen-Westerham (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/214,481

(22) Filed: Aug. 29, 2005

(65) Prior Publication Data

US 2006/0049844 A1 Mar. 9, 2006

(30) Foreign Application Priority Data

Aug. 27, 2004 (DE) .................. 10 2004 041 552

(51) Int. Cl.
*G06F 19/00* (2006.01)

(52) U.S. Cl. ...................... 702/117; 702/118

(58) Field of Classification Search ................ 324/512, 324/527; 702/117, 118, 120; 714/735
See application file for complete search history.

(56) References Cited

U.S. PATENT DOCUMENTS 5,985,497 A * 11/1999 Phan et al. .................. 430/30
6,546,308 B2 * 4/2003 Takagi et al. ................ 700/121
6,617,842 B2 * 9/2003 Nishikawa et al. ......... 324/158.1

OTHER PUBLICATIONS

Martin et al., "FMEA Speeds Time to Market in Photonic IC Manufacturing", Compound Semiconductor Magazine, Nov. 02 pp. 1-4, (4 pages).

* cited by examiner

*Primary Examiner*—Michael Nghiem
*Assistant Examiner*—Douglas N Washburn
(74) *Attorney, Agent, or Firm*—Maginot, Moore & Beck

(57) ABSTRACT

In a method for testing an electric circuit, a first circuit is produced by a first process sequence. A first signal is applied to the first circuit and a signal indicating if the first circuit is defective is generated by comparing the first signal with the first circuit output signal. Then, a second circuit is produced by a second process sequence which includes incorporating at least one intentional defect structure. The first signal is applied to the second circuit and a signal is generated by comparing the first signal with the second circuit output in response to the first signal. A modified signal is applied to the second circuit, until a comparison of the modified signal and the respective response of the second circuit indicates a defective second circuit. Information about the modified signal resulting in the indication of a defective second circuit is stored.

20 Claims, 3 Drawing Sheets

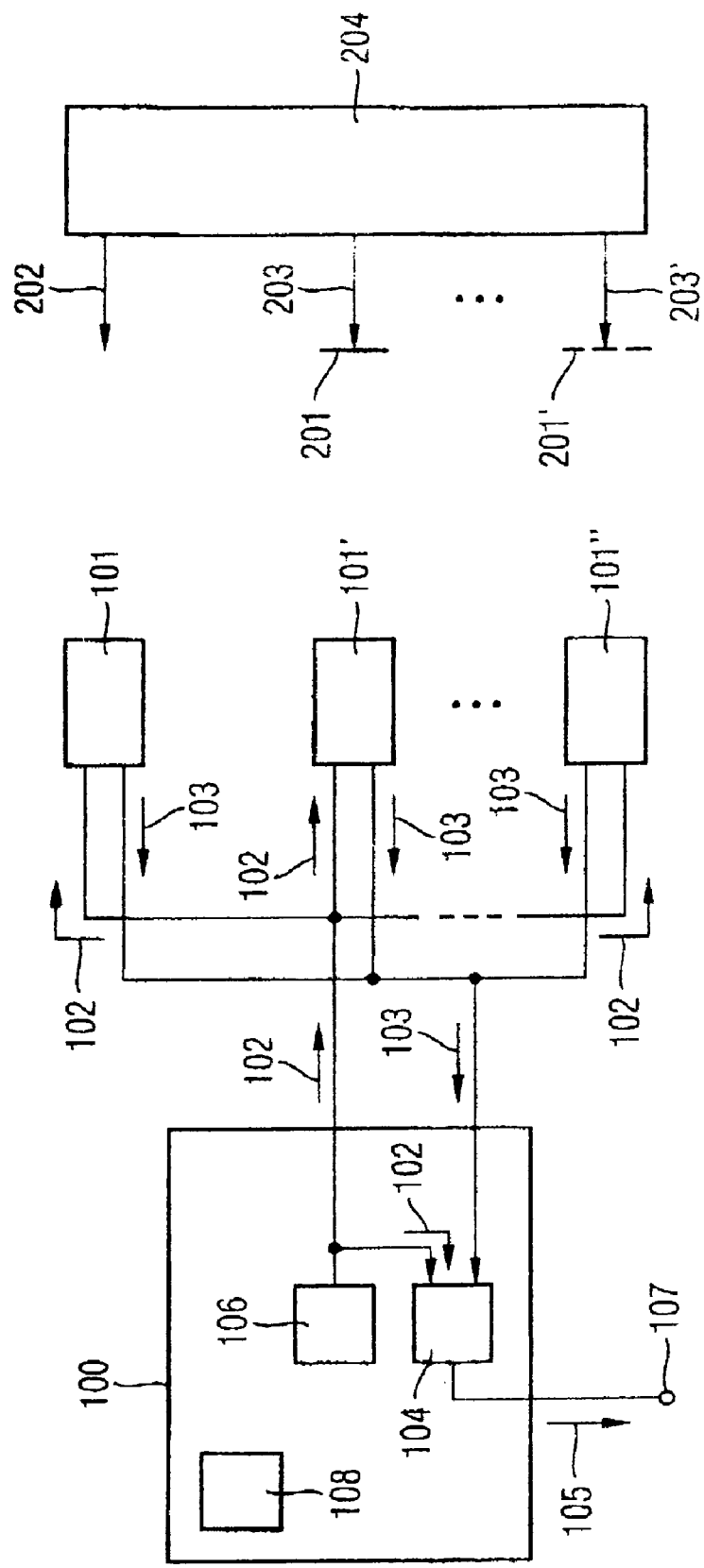

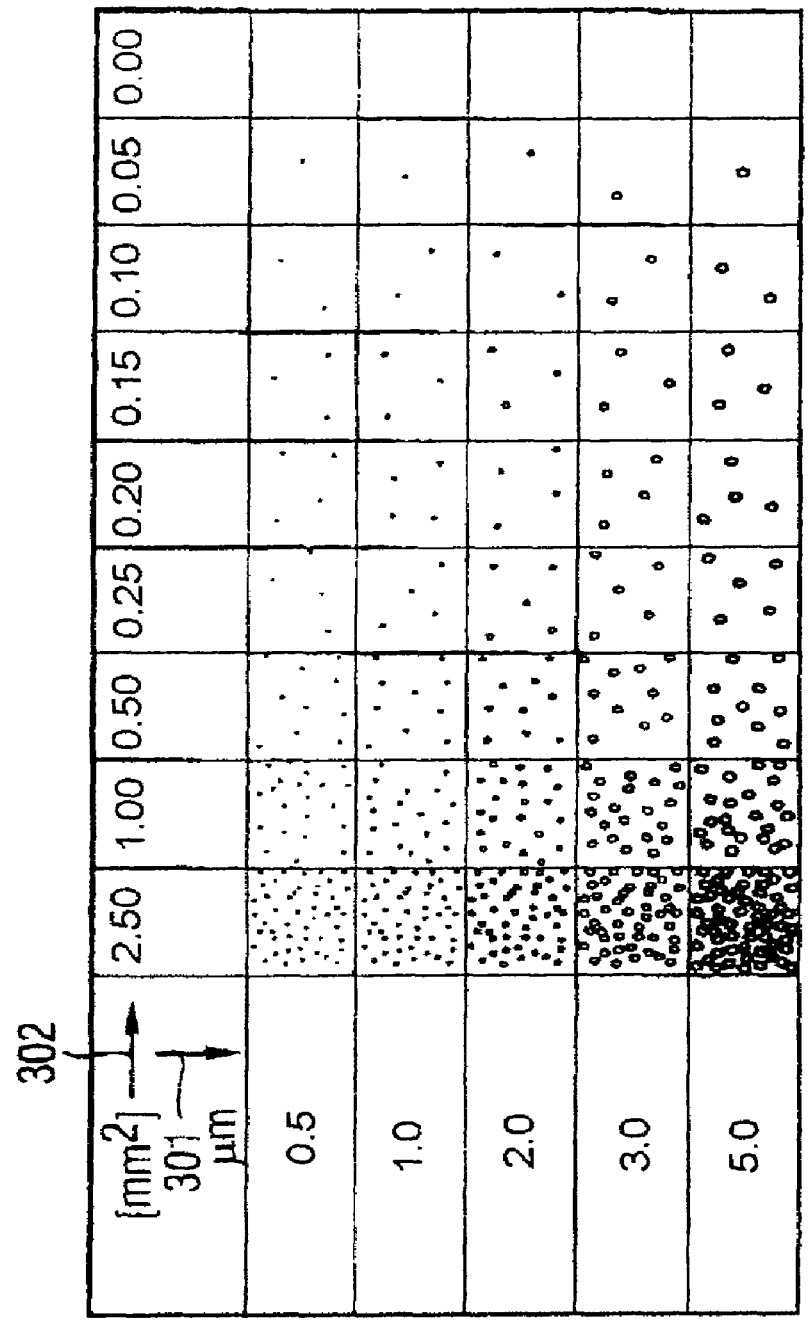

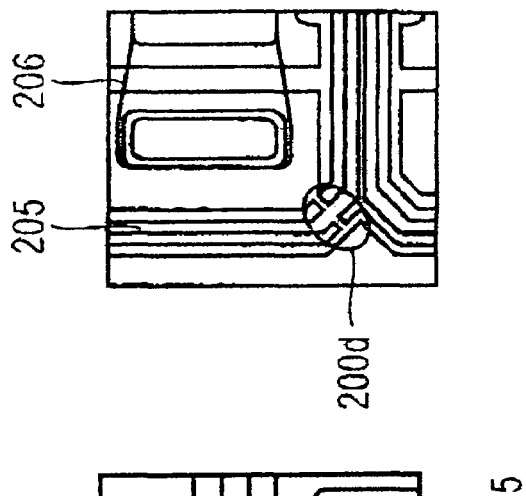

METHOD FOR TESTING AN ELECTRIC CIRCUIT

BACKGROUND OF THE INVENTION

The present invention generally relates to test methods for testing an electric circuit.

DESCRIPTION OF THE RELATED ART

After a circuit has been produced, it is subsequently connected to a test system, and a desired data stream is finally applied to the circuit unit, under predetermined test conditions.

An actual data steam is obtained from the circuit unit to be tested in a manner dependent on the desired data stream, said actual data stream providing a statement about the functionality of the circuit unit to be tested. For this purpose, the actual data stream output from the circuit unit to be tested is compared with the desired data stream fed to the circuit unit to be tested in a comparison unit of the test system in such a way that a result data stream is obtained.

In the development of novel electronic circuit units that are to be tested after they have been fabricated, the functionality of the circuit units is checked by tests during fabrication. Only if such tests proceed positively are the circuit units shipped to an (end) customer.

Such tests for testing the electronic circuit units comprise test contents that relate to a functionality with regard to the specification and a specific parameter range.

Parameter variations are usually implemented with regard to an applied voltage, an ambient temperature, an operating frequency, etc. In this case, parameter ranges are covered during a test of the electronic circuit unit to be tested since a functionality of the electronic circuit unit to be tested is intended to be ensured even when the relevant specifications are exceeded or undershot for a short time. It is evident, however, that during a test of the electronic circuit units to be tested, the latter will fail when a specific upper or lower limit is exceeded or undershot in the context of a parameter variation.

It is customary to refer to the totality of all test contents both with regard to the specification and with regard to the entire functional parameter range as test coverage. For a reliable test of electronic circuit units to be tested, it is essential that such a test coverage is designed to be as wide as possible.

Test methods may comprise a test coverage which, is introduced into the test system through the experience of persons skilled in the art. An existing process sequence for the production of electronic circuit units is optimized empirically with regard to a test coverage in this way.

Problems arise, however, if novel electronic circuit units whose production entails altering the hitherto customary process steps are intended to be tested with high reliability and primarily with high test coverage. Novel aspects of a circuit unit to be tested are checked by means of theoretically developed tests, in which case, in a disadvantageous manner, it is an customer who first checks the functionality of the tested electronic circuit unit in practice. In many cases, it is the (end) customer who first reports back to the manufacturer faults that occur during practical application of electronic circuit units. A quality criterion of the tested electronic circuit unit is disadvantageously reduced with an increasing number of customer reports (or customer returns).

The potential economic success of a new electronic circuit unit essentially depends on two main factors, that is to say a product introduction time ("time-to-market") and a yield. The earlier a novel or newly developed electronic circuit unit is brought to the market, the greater a market share can be, associated with a correspondingly high economic benefit. One problem that accompanies an early market introduction is that the yield is low or the customer returns are high.

For this reason, it is essential to study and learn about processes that are responsible for a reduced yield. In this case, electrical or functional losses of yield are often primarily attributable to local disturbances, such as point defect structures for example.

SUMMARY OF THE INVENTION

One aspect of the present invention is to produce at least one second circuit unit to be tested by means of at least one second predetermined process sequence, predetermined defect structures being impressed on the at least one second circuit unit.

In this way, the method according to the invention makes it possible to obtain the advantage that the test coverage itself can be checked and/or extended by an intentional cultivation of defect structures of different size, form, plane and position in an electronic circuit unit. In this case, it is advantageous for the defect structures produced firstly to be characterized electronically and/or optically by means of an inline check.

The present invention may provide a method of finding and quantifying a yield for technologies and products by creating defect structures by means of a lithography device in a simple manner, the fault probability and the fault modes subsequently being examined.

Defect structures may be introduced with the aid of mask devices during one or more lithography steps. In this case, both holes (conduction track interruptions) and short circuits (conduction track bridgings) may be impressed on the circuit unit to be tested.

The present invention provides a method for testing an electronic circuit having the steps of:

a) producing a circuit unit to be tested by means of a predetermined process sequence;
b) connecting the circuit unit to be tested to a test system;
c) applying a desired data stream to the connected circuit unit, under predetermined test conditions, it being possible for such test conditions to be predetermined by different voltages, temperatures, operating frequencies, etc.;
d) outputting an actual data stream from the circuit unit to be tested in a manner dependent on the desired data stream fed to the circuit unit to be tested;
e) comparing the actual data stream output from the circuit unit to be tested with the desired data stream fed to the circuit unit to be tested in a comparison unit of the test system in order to obtain a result data stream;
f) producing at least one second circuit unit to be tested by means of at least one second predetermined process sequence, predetermined defect structures being impressed on the second circuit unit to be tested;
g) repeating the steps designated under breakdown points b) to f) above with the second circuit unit to be tested that has been produced;
h) varying the test conditions that are defined in section c) above in such a way that a malfunction caused by the impressed defect structures in the second circuit unit to be tested can be detected by means of the comparison of the desired data stream fed to the second circuit unit to be tested with the actual data stream output from the second circuit unit to be tested; and i) storing the varied test conditions in a storage unit of the test system.

In accordance with a restricted version of the inventive method, the circuit unit is formed as a memory module (DRAM=Dynamic Random Access Memory).

In accordance with a further restricted version of the inventive method, the predetermined process sequences for producing the circuit units to be tested, that is to say the predetermined process sequence and the at least one second predetermined process sequence, comprise at least one lithographic step in each case.

In accordance with yet another restricted version of the inventive method, at least one parameter of the desired data stream is varied during testing of the circuit unit to be tested. Preferably, the parameter of the desired data stream that is varied for testing the circuit unit to be tested comprises at least one frequency and/or a voltage level and/or a current level. It is furthermore advantageous that in order to extend the test coverage, to vary a temperature of the circuit unit to be tested or an ambient temperature in the vicinity of the circuit unit to be tested during testing of the circuit unit to be tested.

In accordance with yet another restricted version of the inventive method, the predetermined defect structures are produced by means of a mask device used in the at least one lithography step. It should be pointed out that different mask devices with different types of exposure, that is to say negative exposure or positive exposure, are used for producing holes or short circuits.

Preferably, the defect structures produced by means of the at least one mask device may comprise conduction track interruptions and/or conduction track short circuits. Hereinafter, conduction track generally denotes conduction regions on the electronic circuit units to be tested that have been produced.

The method according to the invention makes it possible for the defect structures produced by means of the at least one mask device to have different sizes.

In accordance with yet another restricted version of the inventive method, initially no defect structures are impressed in the predetermined process sequence for producing the circuit unit to be tested, while predetermined defect structures are impressed in the second predetermined process sequence for producing the second circuit unit to be tested.

In accordance with yet another restricted version of the inventive method, the predetermined defect structures impressed on the second circuit unit to be tested and, if appropriate, further circuit units to be tested in the second predetermined process sequence comprise holes in conduction structures.

The predetermined defect structures may be impressed on the second and, if appropriate, a further circuit unit to be tested in the second predetermined process sequence may comprise holes in a polysilicon plane or in a conduction plane of the electronic circuit unit to be tested.

The predetermined defect structures that are impressed on the at least one second circuit unit in the second predetermined process sequence may comprise bridgings between conduction structures.

The predetermined defect structures impressed on the second circuit unit to be tested in the second predetermined process sequence have a defect structure density in a range of 0 to 2.5 per square millimetre ($mm^{-2}$).

In accordance with yet another restricted version of the inventive method, the predetermined defect structures impressed on the at least one second circuit unit to be tested in the second predetermined process sequence have a defect structure diameter in a range of 0.5 to 5.0 micrometres ($\mu m$).

The possibility of impressing predeterminable defect structures on at least one second electronic circuit may result in an improved test coverage for newly developed electronic circuit units.

DESCRIPTION OF THE DRAWINGS

FIG. 1 is a schematic block diagram of a test system;

FIG. 2 shows examples of mask devices used in the method

FIG. 3 shows defect structures;

DESCRIPTION OF THE PREFERRED EMBODIMENTS

In the Figures identical reference symbols designate identical or functionally identical components.

FIG. 1 illustrates a schematic block diagram of the test device according to the invention. Furthermore, process sequences of the production process are shown schematically.

Specifically, a reference symbol 100 designates a test system having a storage unit 108, a desired data stream generating unit 106 and a comparison unit 104. It should be pointed out that only the essential components of the electronic system are illustrated in each case in the schematic block diagram illustrated in FIG. 1.

According to the invention, a desired data stream 102 is fed to a circuit unit 101 to be tested, whereupon an actual data stream 103 is output from the circuit unit 101 to be tested in a manner dependent on the desired data stream 102 fed thereto. The actual data stream 103 is compared with the desired data stream in the test system 100 by means of the comparison unit 104. A corresponding comparison result is fed to an output unit 107 as a result data stream 105.

On the basis of this comparison result 105 it is possible to obtain a statement about the functionality of the tested electronic circuit unit 101. It shall be assumed, although the present invention is not restricted to this, that firstly a circuit unit 101 to be tested is produced by means of a process sequence 202, in which intentional defect structures are not impressed. For this purpose the production process 204 comprises the process sequences known to the person skilled in the art, such as resist spin, exposure, development, dry etching, resist and polymer removal, etc.

The method according to the invention provides for producing at least one second circuit unit 101', 101'', . . . to be tested by means of at least one second predetermined process sequence 203, 203' . . . . The at least one second predetermined process sequence involves introducing intentional faults in such a way that predetermined defect structures are impressed on the second circuit unit 101', 101'', . . . to be tested. Impressing defect structures of this type will be described below with reference to FIGS. 2 and 3.

The defect structures are impressed by using a lithography step present in the at least one second process sequence 203, in such a way that specially provided mask devices 201, 201' are introduced in order to impress specifically predeterminable defect structures on the at least one second electronic circuit unit 101', 101'', . . . to be tested. In this case it is possible to provide a parametric selection of the defect structures with regard to size, form, plane and position. In this way, rapid learning with regard to a check of the test coverage is effected upon the occurrence of faults in a manner dependent on the impressed defect structures.

FIG. 2 shows examples of mask devices according to the invention in detailed fashion in a tabular arrangement. The mask devices are firstly characterized, with regard to a defect density 302, by a number of defects per square millimetre (mm$^{-2}$) and are secondly characterized by a defect structure diameter 301, specified in micrometres (μm).

It should be pointed out that the defect structure diameters (or the defect sizes) are not illustrated to scale, but rather in greatly exaggerated fashion, in the table in FIG. 2. The defect structures impressed by the mask device 202 in a lithography step of the process sequences are electronically and/or optically characterized by means of an inline check. This is followed by an electrical measurement at the wafer level, component level, by means of a burn-in procedure, and also a module and application test.

A classification of the impressed defect structures makes it possible to examine in a targeted manner such defect structures which, although present in the electronic circuit unit produced, cannot be detected electrically/electronically even though, on account of a characterization of such a defect structure, a fault is expected during testing of the electronic circuit unit to be tested. Such a case identifies a reliability problem of the test system 100. Consequently, an extension/improvement of the test results in an optimization of the test coverage without relying on customer returns. The defect structures that can be impressed by means of the mask device 201, 201' according to the invention comprise firstly interruptions, for example holes in conduction structures, and secondly short circuits, for example bridgings in conduction structures.

In order that such defect structures can be predetermined in variable fashion, the customary lithography method incorporated into a process sequence is modified. In this case, bridgings are produced before the standardized lithographic layer using an additional lithographic layer. In this case, the process sequence comprises the essential process steps of resist spin, exposure using the mask device 201', 201", the defect structures to be impressed being designed as dark regions, development, and plasma-enhanced resist curing. For a negative resist, holes and bridging mask devices are interchanged.

FIGS. 3(a), (b), (c) and (d) show pictures of defect structures 200 impressed on a circuit unit 101' to be tested. It should be pointed out that the pictures shown in FIGS. 3(a) to (d) only represent details from an electronic circuit unit 101' to be tested, in order to illustrate the method according to the invention by way of example.

FIG. 3(a) shows a conduction track structure 205, in which a defect structure 200a in the form of a hole has been impressed. Such defects may cause conduction track interruptions, for example, and generally correspond to resist defects.

FIG. 3(b) shows a defect structure 200b analogous to the defect structure illustrated in FIG. 3(a) in the form of a hole in a conduction plane 206. Such a conduction plane may be formed for example as a polysilicon plane.

FIGS. 3(c) and 3(d) show short circuits or bridgings between conductive structures. In FIG. 3(c) a defect structure 200 in the form of a bridging 200c between two adjacent conduction track structures has been impressed in the electronic circuit unit 101' to be tested. Furthermore, it is possible not only to produce bridgings between conduction track structures 205 but also to provide bridgings between conduction track structures 205 and conduction planes 206. Such a bridging 200d as a predetermined defect structure is illustrated in FIG. 3(d) (identifying circle in the figure).

The defect structures 200 that can be impressed (holes or bridgings) preferably have a defect structure diameter 301 (FIG. 2) in a range of 0.5 to 5.0 micrometres (μm). The defect structure density that can be provided by the mask device 201, 201', . . . of the test system 100 lies in a range of 0 to 2.5 per square millimetre (mm$^{-2}$).

Consequently, the test method according to the invention makes it possible to distinguish between impurity effects and absent conduction structures or defects. The method according to the invention extends the test coverage and opens up the possibility of finding layers within the process sequence where, for example, the predominant number of impurities leads to defects and where most of these defects lead to an erroneous function of the electronic circuit unit 101' to be tested.

The test device according to the invention thus enables not only detection of "hard" malfunctions such as, for example, nodes at an incorrect potential, direct short circuits or line interruptions, but also the detection of "soft" malfunctions, which are also referred to as parametric faults. Such faults are driven by process variations that cannot be influenced. The test method according to the invention can advantageously provoke such faults and thereby provide a further development of the test method with regard to a test coverage. The test conditions are extended in the method according to the invention, for example by producing new bit patterns or bit combinations and varying different test parameters such as, for example, the voltage, the ambient temperature and the operating frequency. The new test conditions can be stored in the test system 100, for example in the storage unit 108 provided there.

Although modifications and changes may be suggested by those skilled in the art, it is the intention fo the inventors to embody within the patent warranted heron all changes and modifications as reasonably and properly come within the scope of their contribution to the art.

We claim as our invention:

1. A method for testing an electric circuit, comprising:
   a) applying a first data signal to a first electric circuit, the first electric circuit produced by a first process sequence;
   b) generating a signal indicative if said first electric circuit is defective by comparing a second data signal with a data signal generated by said first electric circuit in response to said first data signal;
   c) producing a second electric circuit by a predetermined second process sequence which includes incorporating intentionally at least one predetermined defect structure into said second electric circuit;
   d) applying the first data signal to said second electric circuit and comparing the second data signal with a data signal generated by said second electric circuit in response to said first data signal;
   e) repeatedly modifying the first data signal and applying said modified first data signal to said second electric circuit until said comparison indicates a defect of said second electric circuit; and
   f) storing information about the modified first data signal which results in said indication about the defect of said second electric circuit.

2. The method of claim 1, further comprising
g) producing a third electric circuit by a predetermined third process sequence which includes incorporating intentionally at least a second predetermined defect structure into said third electric circuit;
h) applying the first data signal to said third electric circuit and comparing the second data signal with a data signal generated by said third electric circuit in response to said first data signal;
i) repeatedly further modifying the first data signal and applying said further modified first data signal to said third electric circuit until said comparison indicates a defect of said third electric circuit; and
f) storing information about the further modified first data signal which results in said indication about the defect of said third electric circuit.

3. The method of claim 1, wherein said first electric circuit and said second electric circuit comprise memory modules.

4. The method of claim 1, wherein said first and second predetermined process sequences comprise at least one lithography step.

5. The method of claim 1, wherein said first data signal includes at least one variable parameter.

6. The method of claim 5, wherein said variable parameter is at least one of a frequency, a voltage level or a current level of said data signal.

7. The method of claim 1, further comprising repeating step b) while varying a temperature of said first electric circuit.

8. The method of claim 1, wherein step c) further comprises incorporating said least one predetermined defect structure into said second electric circuit using a mask device during a lithography process.

9. The method of claim 8, wherein said defect structure is a defect in a conduction track of the second electric circuit.

10. The method of claim 1, wherein step c) further comprises incorporating a plurality of defect structures having different sizes into the second electric circuit.

11. The method of claim 1, wherein said first electric circuit is free of intentionally incorporated defect structures.

12. The method of claim 1, wherein said second electric circuit comprises a conduction track and step c) further comprises incorporating said at least one defect structure as a hole in said conduction track.

13. The method of claim 1, wherein said second electric circuit comprises a conduction plane and and step c) further comprises incorporating said at least one defect structure as a hole in said conduction plane.

14. The method of claim 1, wherein said second electric circuit comprises a plurality of conduction tracks and step c) further comprises incorporating said at least one defect structure as a bridge between at least two of said conduction tracks.

15. The method of claim 1, wherein said second electric circuit comprises at least one conduction track and at least one conduction plane and step c) further comprises incorporating said at least one defect structure as a bridge between said conduction track and said conduction plane.

16. The method of claim 1, wherein step c) further comprises incorporating said at least one defect structure such that said defect structure has a density in a range of 0 to 2.5 per square millimeter.

17. The method of claim 1, wherein step c) further comprises incorporating said at least one defect structure such that said defect structure has a density in a range of 0.5 to 5.0 micrometers.

18. The method of claim 1, wherein the first data signal is the second data signal.

19. A method for testing an electric circuit, comprising:
a) applying a first data signal to a first electric circuit, the first electric circuit produced by a first process sequence;
b) generating a signal indicative if said first electric circuit is defective by comparing a second data signal with a data signal generated by said first electric circuit in response to said first data signal;
c) providing a second electric circuit generated by a predetermined second process sequence which includes incorporating intentionally at least one predetermined defect structure into said second electric circuit;
d) determining a third data signal, the third data signal configured such that when applied to said second electric circuit, a comparison of the second data signal with a data signal generated by said second electric circuit in response to said third data signal indicates a defect of said second electric circuit;
and e) storing information about the third data signal which results in said indication about the defect of said second electric circuit.

20. The method of claim 19, wherein the first data signal and the second data signal comprise the same data stream.

* * * * *